United States Patent
Taniguchi et al.

(10) Patent No.: US 12,047,076 B2
(45) Date of Patent: Jul. 23, 2024

(54) SEMICONDUCTOR DEVICE

(71) Applicant: LAPIS Technology Co., Ltd., Yokohama (JP)

(72) Inventors: Shingo Taniguchi, Yokohama (JP); Tetsuo Oomori, Yokohama (JP)

(73) Assignee: LAPIS Technology Co., Ltd., Yokohama (JP)

(*) Notice: Subject to any disclaimer, the term of this patent is extended or adjusted under 35 U.S.C. 154(b) by 0 days.

(21) Appl. No.: 18/187,667

(22) Filed: Mar. 22, 2023

(65) Prior Publication Data
US 2023/0318583 A1 Oct. 5, 2023

(30) Foreign Application Priority Data

Mar. 31, 2022 (JP) ................................ 2022-061349

(51) Int. Cl.
*G01R 19/165* (2006.01)
*H03K 3/0233* (2006.01)
*H03K 5/24* (2006.01)

(52) U.S. Cl.
CPC ... *H03K 3/02337* (2013.01); *G01R 19/16533* (2013.01); *G01R 19/16566* (2013.01); *H03K 5/2481* (2013.01)

(58) Field of Classification Search
CPC ...... H03K 3/02; H03K 3/023; H03K 3/02337; H03K 5/22; H03K 5/24; H03K 5/2472; H03K 5/2481; G01R 19/165; G01R 19/16533; G01R 19/16566; G01R 19/16571; G01R 19/16576
See application file for complete search history.

(56) References Cited

U.S. PATENT DOCUMENTS 10,505,519 B1* 12/2019 Chen ...................... H03K 3/037
10,921,836 B2* 2/2021 Singh ...................... G05F 1/565

FOREIGN PATENT DOCUMENTS

JP 2017092655 5/2017

* cited by examiner

*Primary Examiner* — Long Nguyen
(74) *Attorney, Agent, or Firm* — JCIPRNET

(57) ABSTRACT

A semiconductor device includes: a first input to which an input signal is input; a second input to which a reference signal is input; and a comparison stage which includes a current source connected to a first potential and first and second current path parts connected between the current source and a second potential different from the first potential and performing a comparison operation in response to the input signal and the reference signal, wherein the first and second current path parts respectively include first and second input circuits which are connected to the current source and first and second load circuits which are connected between the second potential and the first and second input circuits, wherein the first input circuit includes a first signal transistor and a first reference transistor, and wherein the second input circuit includes a second signal transistor and a second reference transistor.

18 Claims, 5 Drawing Sheets

SEMICONDUCTOR DEVICE

CROSS-REFERENCE TO RELATED APPLICATION

This application claims the priority benefits of Japanese application no. 2022-061349, filed on Mar. 31, 2022. The entirety of the above-mentioned patent application is hereby incorporated by reference herein and made a part of this specification.

BACKGROUND

Technical Field

The disclosure relates to a semiconductor device.

Description of Related Art

Patent Document 1 (Japanese Patent Laid-Open No. 2017-92655) discloses a comparator. This comparator can suppress a variation in an input offset voltage even during a comparison operation.

Circuits such as AD converters, switching power supplies, supervisory circuits, and delta-sigma modulators use comparators to compare the voltages at two nodes. Comparators in these circuits work in a variety of operating environments. Various waveforms of the input signal, for example, a large-amplitude steep waveform, a large-amplitude slow waveform, and a small-amplitude slow waveform are input to the comparator. When noise is superimposed on a slow waveform, the comparator may chatter at its output in response to the noise.

The disclosure provides a semiconductor device capable of reducing the occurrence of chattering.

SUMMARY

A semiconductor device according to a first aspect of the disclosure includes: a first input to which an input signal is input; a second input to which a reference signal is input; and a comparison stage which includes a current source connected to a first potential and first and second current path parts connected between the current source and a second potential different from the first potential and performing a comparison operation in response to the input signal and the reference signal, wherein the first and second current path parts respectively include first and second input circuits which are connected to the current source and first and second load circuits which are connected between the second potential and the first and second input circuits, wherein the first input circuit includes a first signal transistor and a first reference transistor which are connected in parallel so that the input signal is input to the first signal transistor and the reference signal is input to the first reference transistor, and wherein the second input circuit includes a second signal transistor and a second reference transistor which are connected in parallel so that the input signal is input to the second signal transistor and the reference signal is input to the second reference transistor.

Figure 2:
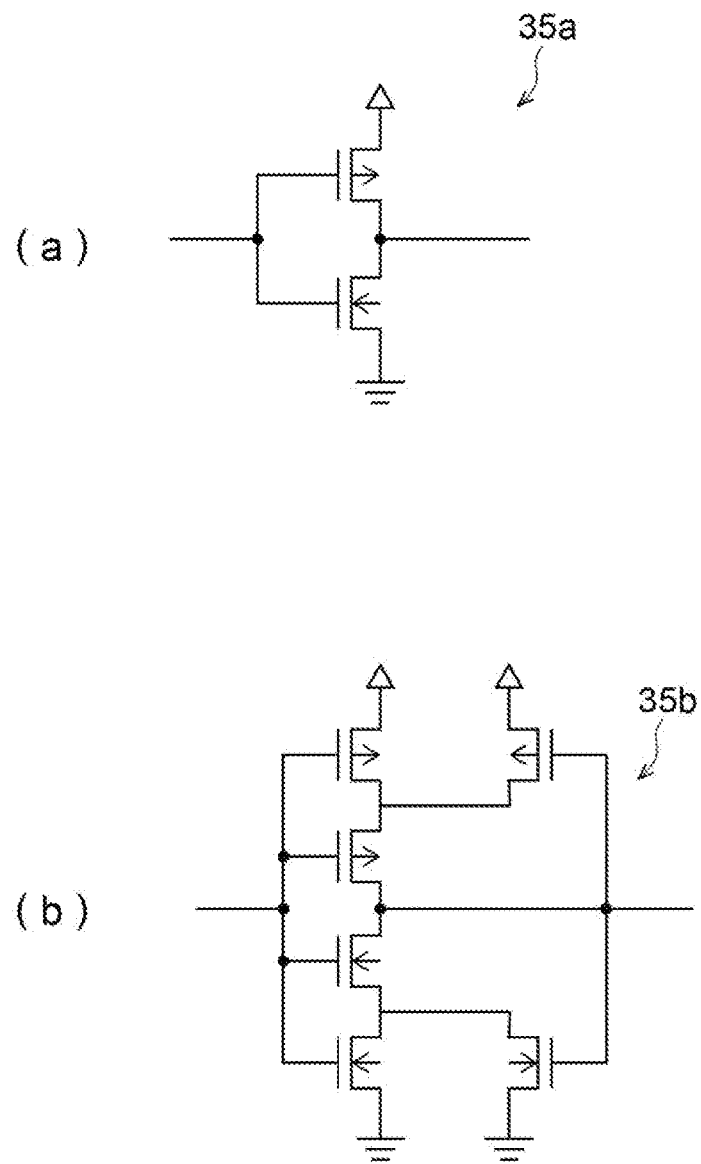

(a) and (b) of FIG. 2 are circuit diagrams showing logic circuits for an output of the comparator according to an embodiment of the disclosure.

Figure 3:
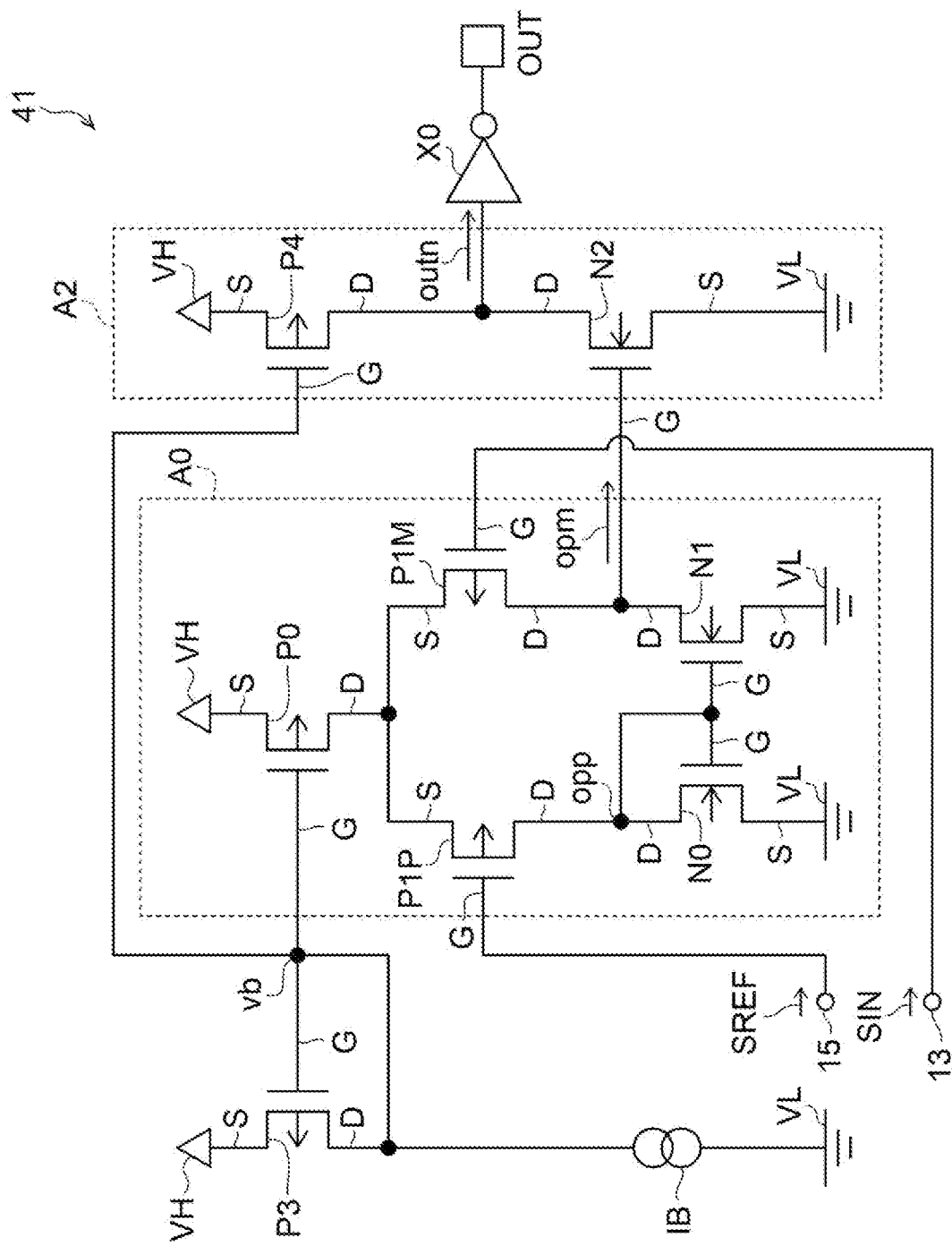

FIG. 3 is a circuit diagram showing a comparator not provided with a first reference transistor and a second signal transistor.

Figure 4:
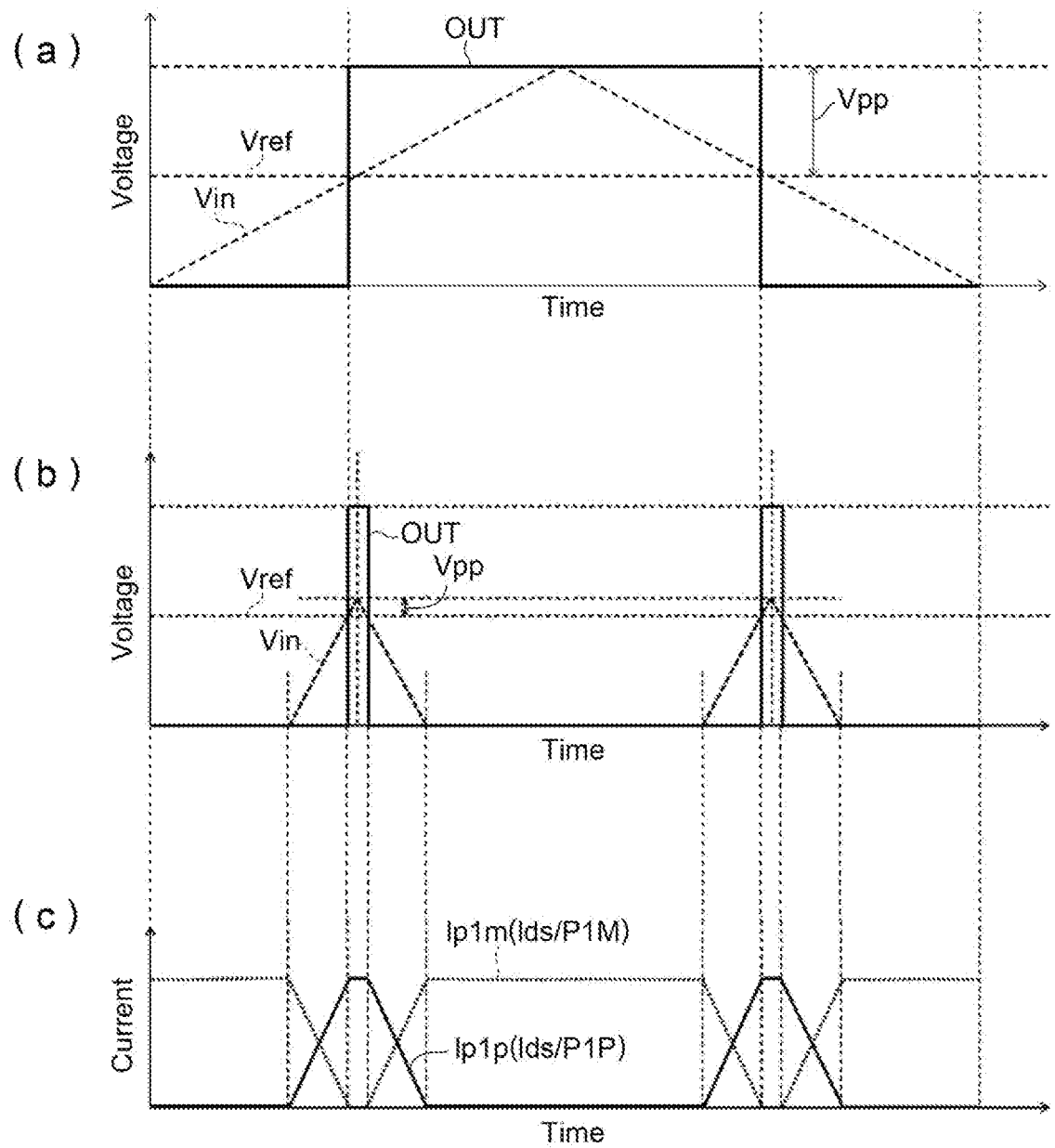

FIG. 4 is a graph showing a circuit simulation result of the comparator shown in FIG. 3.

Figure 5:
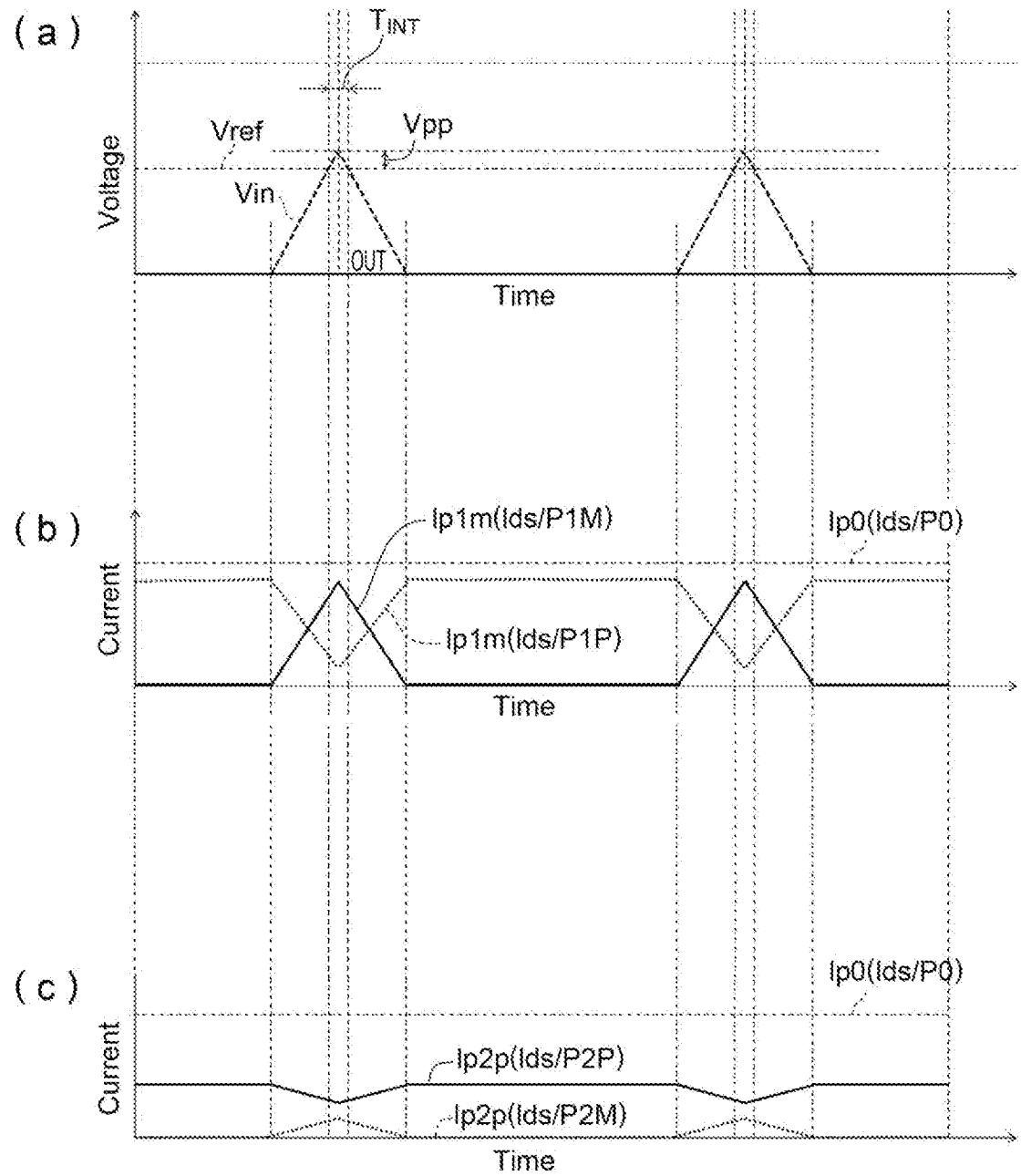

FIG. 5 is a graph showing a circuit simulation result of the comparator according to an embodiment of the disclosure.

DESCRIPTION OF THE EMBODIMENTS

According to this semiconductor device, the input signal is input to the first signal transistor of the first current path part and the second signal transistor of the second current path part. The current of the current source is divided into both the first current path part and the second current path part in response to the input signal. By the division of current, the response speed of the comparison operation of the comparison stage slows down, that is, the voltage change rate of the node slows down.

Accordingly, the comparison stage does not respond to short duration waveforms (for example, noise).

According to the above-described aspect, it is possible to provide the semiconductor device capable of reducing the occurrence of chattering.

Hereinafter, each embodiment for carrying out the disclosure will be described with reference to the drawings. In the subsequent description, the same or similar parts are denoted by the same or similar reference numerals to avoid redundant description.

Figure 1:
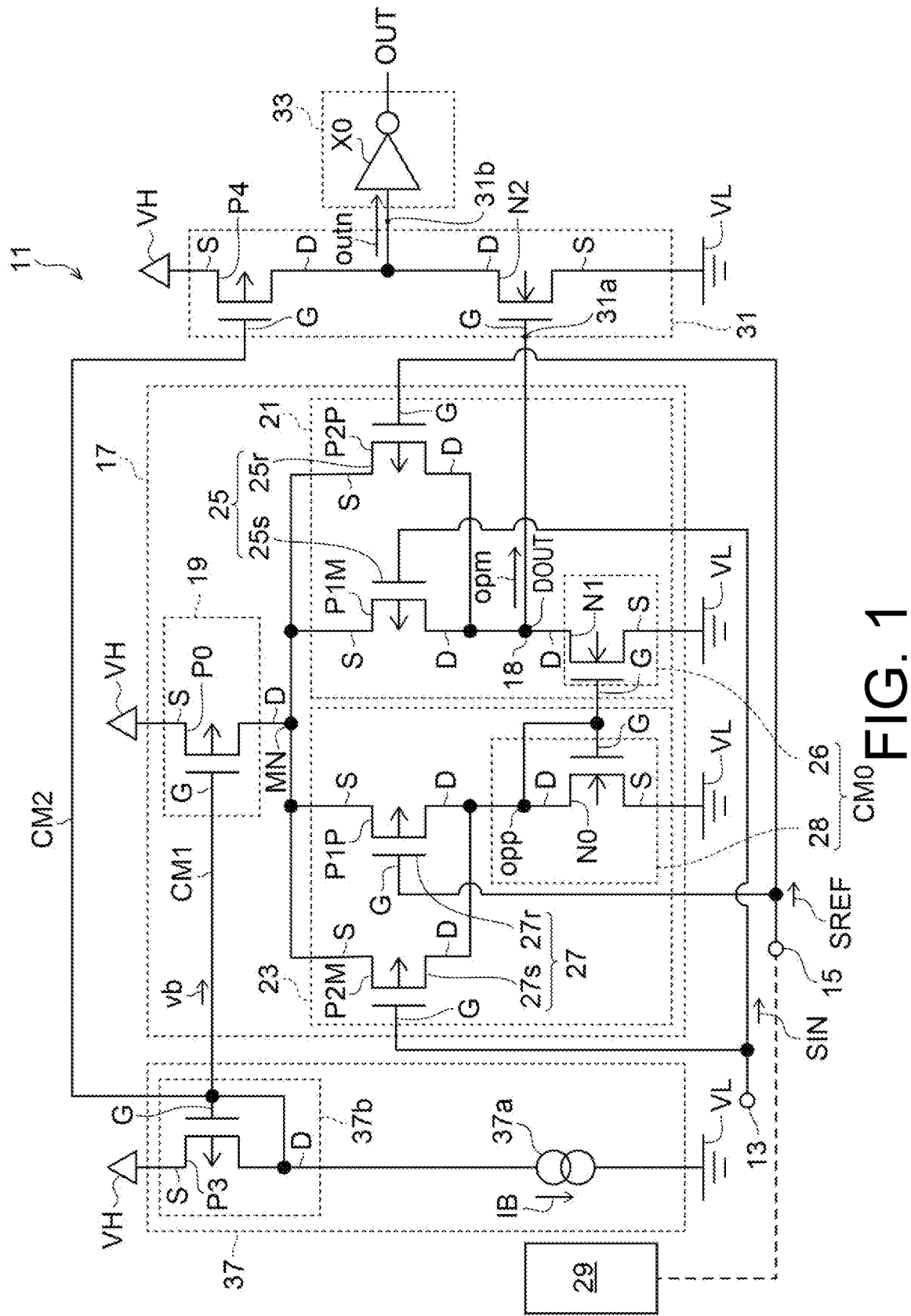
FIG. 1 is a circuit diagram schematically showing a comparator according to an embodiment of the disclosure.

FIG. 1 is a circuit diagram schematically showing a comparator according to an embodiment of the disclosure. In FIG. 1, a transistor constituting the comparator is drawn with a field effect transistor circuit symbol for simple illustration. The field effect transistor includes a source electrode, a drain electrode, and a gate electrode and these are commonly referred to as "S", "D", and "G", respectively, for transistors in circuit diagrams.

A comparator 11 includes a first input 13 which receives an input voltage, a second input 15 which receives a reference voltage, and a comparison stage 17.

The comparison stage 17 includes an output 18, a current source 19, a first current path part 21, and a second current path part 23. The first current path part 21 and the second current path part 23 are connected to the current source 19 and a current of the current source 19 is divided and flows to the first current path part 21 and the second current path part 23.

The first current path part 21 and the current source 19 are connected in series between a first potential VH (for example, a power supply potential) and a second potential VL (for example, a ground potential) different from the first potential VH and the second current path part 23 and the current source 19 are connected in series between the first potential VH and the second potential VL. Specifically, the current source 19 is connected between the first potential VH and an intermediate node MN of the comparison stage 17. The first current path part 21 and the second current path part 23 are connected in parallel between the second potential VL and the intermediate node MN of the comparison stage 17.

The first current path part 21 includes a first input circuit 25 and a first load circuit 26 and the first input circuit 25 and the first load circuit 26 are sequentially connected in series in the direction from the current source 19 to the second potential VL. The first input circuit 25 may include a plurality of transistors connected in parallel, in this embodiment, a first signal transistor 25s and a first reference transistor 25r. Each of the first signal transistor 25s and the first reference transistor 25r is connected in series to the first load circuit 26.

The second current path part 23 includes a second input circuit 27 and a second load circuit 28 and the second input circuit 27 and the second load circuit 28 are sequentially connected in series in the direction from the current source 19 to the second potential VL. The second input circuit 27 may include a plurality of transistors connected in parallel to each other, in this embodiment, a second signal transistor 27s and a second reference transistor 27r. Each of the second signal transistor 27s and the second reference transistor 27r is connected in series to the second load circuit 28.

The current source 19, the first input circuit 25, and the second input circuit 27 are connected together at the intermediate node MN. The comparison stage 17 has different circuit connections than a differential amplifier stage described below.

The transistor size ($W_{R1}/L_{R1}$) of the first reference transistor 25r is smaller than the transistor size ($W_{R2}/L_{R2}$) of the second reference transistor 27r and the transistor size ($W_{S2}/L_{S2}$) of the second signal transistor 27s is smaller than the transistor size ($W_{S1}/L_{S1}$) of the first signal transistor 25s. Here, the size of the transistor (or the transistor size) is defined by the ratio (W/L) of the transistor width (W) of the field effect transistor to the transistor length (L) of the field effect transistor.

Further, the transistor size ($W_{R1}/L_{R1}$) of the first reference transistor 25r is smaller than the transistor size ($W_{S1}/L_{S1}$) of the first signal transistor 25s. Further, the transistor size ($W_{S2}/L_{S2}$) of the second signal transistor 27s is smaller than the transistor size ($W_{R2}/L_{R2}$) of the second reference transistor 27r.

The first signal transistor 25s and the second signal transistor 27s are operated in response to an input signal SIN from the first input 13. The first reference transistor 25r and the second reference transistor 27r are operated in response to a reference signal SREF from the second input 15. The first and second signal transistors 25s and 27s to which the input signal SIN is input and the first and second reference transistors 25r and 27r to which the reference signal SREF is input perform a comparison operation according to the input signal SIN and the reference signal SREF.

According to this comparator 11, the input signal SIN from the first input 13 is applied to the first signal transistor 25s of the first current path part 21 and the second signal transistor 27s of the second current path part 23. Further, the reference signal SREF from the second input 15 is applied to the first reference transistor 25r of the first current path part 21 and the second reference transistor 27r of the second current path part 23. The current flowing through the current source 19 is divided and flows to the first current path part 21 and the second current path part 23 in response to the input signal SIN from the first input 13 and the reference signal SREF from the second input 15. This division slows down a voltage change rate of the node in the comparison stage 17. Accordingly, the comparison stage 17 becomes less responsive to short duration waveforms such as noise. That is, it becomes difficult to perform a comparison operation with respect to noise.

Specifically, both the first signal transistor 25s of the first current path part 21 and the second signal transistor 27s of the second current path part 23 are operated in response to the input signal SIN from the first input 13, both the first reference transistor 25r of the first current path part 21 and the second reference transistor 27r of the second current path part 23 are operated in response to the reference signal SREF from the second input 15, and the current source 19 defines the total amount of current flowing through the first current path part 21 and the second current path part 23. The division to the first signal transistor 25s and the second signal transistor 27s operated in response to the input signal SIN from the first input 13 reduces the amount of current flowing to one of the first current path part 21 and the second current path part 23. Further, the division to the first reference transistor 25r and the second reference transistor 27r operated in response to the signal SREF from the second input 15 reduces the amount of current flowing to one of the first current path part 21 and the second current path part 23. The decrease in the amount of current flowing through the first current path part and the second current path part slows down a change in the voltage waveform of the node of the comparison stage 17. The delay in voltage waveform change prevents the comparison stage 17 from responding to noise superimposed on the signal waveform input to the first signal transistor 25s and the second signal transistor 27s, for example, small amplitude spike noise. That is, even if noise is superimposed on the input signal waveform, the comparison stage 17 is prevented from performing a comparison operation according to the noise.

Since the first reference transistor 25r and the second reference transistor 27r receive the reference signal SREF from the second input 15, a change in the amount of current in the comparison stage 17 is caused by an operation in response to the input signal SIN from the first input 13. Further, the total amount of current in the comparison stage 17 is determined by the current source 19 and is divided by the transistor size of each of the first signal transistor 25s, the second signal transistor 27s, the first reference transistor 25r, and the second reference transistor 27r. The division according to the transistor size will be described later.

Referring again to FIG. 1, the comparator 11 further includes a reference voltage source 29. The reference voltage source 29 generates the reference signal SREF having a reference voltage. The first reference transistor 25r and the second reference transistor 27r receive the reference signal SREF from the reference voltage source 29. The reference voltage source 29 may include, for example, a bandgap circuit that produces a constant voltage or a resistive voltage divider circuit.

The comparator 11 further includes an output stage 31 which receives a signal opm from the output 18 of the comparison stage 17. The output stage 31 can be configured to amplify the signal from the output 18 of the comparison stage 17. The output stage 31 includes an input 31a and an output 31b connected to the output 18 of the comparison stage 17.

The comparator 11 includes a logic circuit 33 which converts an output signal outn from the output stage 31 into a logic level signal, the logic circuit 33 can include, for example, a logic gate such as an inverter circuit or a hysteresis circuit such as a Schmitt trigger circuit, (a) and (b) of FIG. 2 respectively show an inverter circuit 35a or a Schmitt trigger circuit 35b provided as a CMOS circuit, and these circuits can be operated as the logic circuit 33.

The comparator 11 includes a voltage source circuit 37 and the voltage source circuit 37 can include a current source 37a and a load circuit 37b. The load circuit 37b includes, for example, one or more transistors connected to form a current mirror circuit. The current source 37a generates a constant current IB.

In the comparison stage 17, the first load circuit 26 and the second load circuit 28 include at least one (specifically, any one, any two, or all) of a current mirror circuit, a transistor having a gate and a drain connected together (diode-connected transistor), and a resistor.

Specifically, as shown in FIG. 1, the first load circuit 26 and the second load circuit 28 can be constituted by a current mirror circuit CM0. According to this comparator 11, the current mirror circuit CM0 can be applied to the load of the comparison stage 17. The current mirror circuit CM0 can transmit a change in current of the second signal transistor 27s of the second current path part 23 to the first current path part 21.

Further, each of the first load circuit 26 and the second load circuit 28 can include a transistor having a gate and a drain connected together. In the subsequent description, a transistor (referred to as the "diode-connected transistor") can be included and the conductivity type of this transistor is different from the conductivity type of the transistors in the first input circuit 25 and the second input circuit 27. According to this comparator 11, the diode-connected transistor can be applied to the load of the comparison stage 17.

Further, each of the first load circuit 26 and the second load circuit 28 can include a resistor and the resistor includes at least one of semiconductor conductive regions for the source S and drain D of the transistor, a gate conductive layer for the gate electrode (G), and/or a specially prepared resistive layer. According to this comparator 11, the resistor can be applied to the load of the comparison stage 17.

Next, the connection of the transistors in the comparator 11 shown in FIG. 1 will be described.

The comparison stage 17 includes a first conductivity type (for example, p-type) transistor (P0) configured to be operated as the current source 19, and in the transistor (P0), the source S is connected to the second potential VH, the gate G receives a signal vb from the voltage source circuit 37, and the drain D is connected to the sources S of the first conductivity type transistors (P1M and P2P) connected in parallel inside the first input circuit 25 of the first current path part 21. The drains D of the transistors (P1M and P2P) connected in parallel are connected to the drain D of the second conductivity type (for example, n-type) transistor (N1) of the first load circuit 26.

Further, the drain D of the transistor (P0) is connected to the sources S of the first conductivity type transistors (P2M and P1P) connected in parallel inside the second input circuit 27 of the second current path part 23. The drains D of the transistors (P2M and P1P) connected in parallel are connected to the drain D and the gate G of the second conductivity type transistor (N0) of the second load circuit 28. The transistor (N0) and the transistor (N1) constitute the current mirror circuit CM0. The sources S of the transistors (N0 and N1) are connected to the second potential VL. The node (opp) transmits the amount of current flowing through the second current path part 23 to the first load circuit 26 of the second current path part 21.

The output stage 31 includes a second conductivity type transistor (N2). The gate G of the transistor (N2) is connected to the output 18 of the comparison stage 17 and receives an output signal (opm). The source S of the transistor (N2) is connected to the second potential VL and the drain D of the transistor (N2) is connected to the drain D of the second conductivity type transistor (P4). The source S of the transistor (P4) is connected to the first potential VH and the gate G of the transistor (P4) receives a signal vb from the voltage source circuit 37.

The voltage source circuit 37 includes the current source 37a which generates the constant current IB and the first conductivity type transistor (P3), the current source 37a is connected to the drain D and the gate G of the transistor (P3), and the source S of the transistor (P3) is connected to the first potential VH. The gate G of the transistor (P3) provides the signal vb. The transistor (P3) constitutes a current mirror circuit CM1 together with the transistor (P0) and constitutes a current mirror circuit CM2 together with the transistor (P4).

Referring to FIG. 1, each of the first signal transistor 25s, the first reference transistor 25r, the second signal transistor 27s, and the second reference transistor 27r is a p-type MOS transistor. This embodiment is not limited thereto and the comparator 11 includes the first signal transistor 25s, the first reference transistor 25r, the second signal transistor 27s, and the second reference transistor 27r of an n-type MOS transistor.

The division according to the transistor size will be described. As described above, the transistor size ($W_{S1}/L_{S1}$) of the first signal transistor 25s is set to be larger than the transistor size ($W_{S2}/L_{S2}$) of the second signal transistor 27s.

The size ratio ($W_{S1}/L_{S1}$)/($W_{S2}/L_{S2}$) of the transistor size ($W_{S1}/L_{S1}$) of the first signal transistor 25s with respect to the transistor size ($W_{S2}/L_{S2}$) of the second signal transistor 27s determines the division ratio for the input signal SIN in each of the first current path part 21 and the second current path part 23.

Further, the division ratio for each of the first current path part 21 and the second current path part 23 can be determined also by the size ratio of the transistor size of the second reference transistor 27r ($W_{R2}/L_{R2}$) with respect to the transistor size ($W_{R1}/L_{R1}$) of the first reference transistor 25r. By providing the first reference transistor 25r of the first current path part 21, the symmetry of the circuit between the second signal transistor 27s and the second reference transistor 27r of the second current path part 23 can be compensated. Further, the transistor size ($W_{R2}/L_{R2}$) of the second reference transistor 27r is set to be larger than the transistor size ($W_{R1}/L_{R1}$) of the first reference transistor 25r.

In the comparison stage 17 in which the second signal transistor 27s is provided at the second current path part 23 and the first reference transistor 25r is provided at the first current path part 21, the fixed current amount of the current source 19 is divided into the first current path part 21 and the second current path part 23 according to the division ratio in response to the input signal SIN. The division ratio changes, for example, the response speed of the comparison operation of the comparison stage 17. When the transistor size of the second signal transistor 27s of the second current path part 23 with respect to the transistor size of the first signal transistor 25s of the first current path part 21 is increased, the response speed of the comparison operation slows down and the change in the voltage waveform at the node of the comparison stage 17 can be slowed down.

The transistor sizes of the transistors of the first input circuit 25 and the second input circuit 27 of the comparison stage 17 can be set as follows as an example. The transistor size ($W_{S1}/L_{S1}$) of the first signal transistor 25s is the same as the transistor size ($W_{R2}/L_{R2}$) of the second reference transistor 27r. The transistor size ($W_{S2}/L_{S2}$) of the second signal transistor 27s is the same as the transistor size ($W_{R1}/L_{R1}$) of the first reference transistor 25r.

Referring to FIGS. 3, 4, and 5, the operations of the comparators 11 and 41 will be described. Reference symbols in the graphs of FIGS. 4 and 5 are shown below.

Ip1m: drain current (Ids) of transistor (P1M)
Ip1p: drain current (Ids) of transistor (P1P)
Ip2m: drain current (Ids) of transistor (P2M)
Ip2p: drain current (Ids) of transistor (P2P)
Ip0: current of current source of comparison stage
Vref: reference voltage value of comparator FIG. 3 is a circuit diagram showing a comparator 41 not provided with the first reference transistor 25r and the second signal transistor 27s. In FIG. 4, for ease of understanding, circuit symbols and nodes in a differential amplifier stage A0, an output stage A2, and a logic gate X0 are indicated by reference symbols of the circuit symbols and nodes corresponding to the circuit of FIG. 1 to avoid redundant description if necessary.

(a) of FIG. 4 shows the voltage waveform of the output OUT of the comparator 41 that receives a large-amplitude input voltage Vin (a difference Vpp in amplitude between the reference voltage Vref and the input voltage Vin is large). The differential amplifier stage A0 of the comparator 41 detects that the input voltage Vin crosses the reference voltage Vref and the output OUT changes rapidly.

(b) of FIG. 4 shows the voltage waveform of the output OUT of the comparator 41 that receives a small-amplitude input voltage Vin (the difference Vpp in amplitude between the reference voltage Vref and the input voltage Vin is small). The small-amplitude input voltage Vin imitates the noise input to the comparator 41. In the comparator 41, the output OUT changes rapidly while the input voltage Vin crosses the reference voltage Vref. The output OUT exhibits a rectangular pulse waveform.

(c) of FIG. 4 shows respective currents (transistor drain currents) flowing through two current paths of the differential amplifier stage A0 of the comparator 41 that receives the small-amplitude input voltage Vin.

(a) of FIG. 5 shows the voltage waveform of the output OUT of the comparator 11 that receives the small-amplitude input voltage Vin shown in (b) of FIG. 4. The signal input of the comparator 11 receives the input voltage Vin that changes in a triangular shape with the passage of time. The input voltage Vin is characterized by a section in which a dashed line indicating the reference voltage value Vref and the peak voltage value corresponding to the vertex of the triangle crosses the triangle. Referring to the waveform of (a) of FIG. 5, the output OUT does not change during the crossover period $T_{INT}$ in which the input wave voltage Vin crosses the reference voltage Vref. This indicates that the comparator 11 does not respond to noise-like inputs and prevents the occurrence of chattering. The comparator 11 changes the output OUT in response to a certain peak voltage value larger than the waveform of (a) of FIG. 5 and/or another input voltage having a certain crossover wider than the waveform of (a) of FIG. 5.

From the viewpoint of preventing the chattering, a plurality of triangular input voltages having different peak voltage value and simulating noise is applied to the comparator 11 and a differential voltage between the reference voltage value Vref of the reference voltage source 29 and the peak voltage value at which the output OUT of the comparator 11 is inverted (referred to as the "inversion voltage value") is useful for designing the comparator 11.

Further, the comparator 11 can generate the output voltage waveform shown in (a) of FIG. 4 in response to the input voltage when receiving the large-amplitude input voltage Vin shown in (a) of FIG. 4.

(b) of FIG. 5 shows the division of current in the transistors (P1P and P1M) of the comparator 11 and (c) of FIG. 5 shows the division of current in the transistors (P2P and P2M) of the comparator 11.

Based on the results of various circuit simulations for the design of the comparator 11, the following exemplary design guidelines are provided.

The size ratio $(W_{S1}/L_{S1}):(W_{R1}/L_{R1})$ between the transistor size $(W_{R1}/L_{R1})$ of the first reference transistor 25r and the transistor size $(W_{S1}/L_{S1})$ of the first signal transistor 25s is, for example, 1:3. At this time, the division ratio between the amount of current flowing through the first reference transistor 25r and the amount of current flowing through the first signal transistor 25s can be set to 1:3.

The size ratio $(W_{R2}/L_{R2}):(W_{S2}/L_{S2})$ between the transistor size $(W_{S2}/L_{S2})$ of the second signal transistor 27s and the transistor size $(W_{R2}/L_{R2})$ of the second reference transistor 27r is, for example, 1:3. At this time, the division ratio between the amount of current flowing through the second signal transistor 27s and the amount of current flowing through the second reference transistor 27r can be set to 1:3.

According to this comparator 11, the size ratio between the transistors of the first current path part 21 and the second current path part 23 defines the division ratio between the current amounts of the first current path part 21 and the second current path part 23.

Based on the results of various circuit simulations for the design of the comparator 11, another exemplary design guideline is provided as follows.

The size ratio $(W_{S1}/L_{S1}):(W_{S2}/L_{S2})$ between the transistor size $(W_{S2}/L_{S2})$ of the second signal transistor 27s and the transistor size $(W_{S1}/L_{S1})$ of the first signal transistor 25s is, for example, 3:1. At this time, the division ratio between the amount of current flowing through the second signal transistor 27s and the amount of current flowing through the first signal transistor 25s can be set to 3:1.

The size ratio $(W_{R2}/L_{R2}):(W_{R1}/L_{R1})$ between the transistor size $(W_{R1}/L_{R1})$ of the first reference transistor 25r and the transistor size $(W_{R2}/L_{R2})$ of the second reference transistor 27r is, for example, 1:3. At this time, the division ratio between the amount of current flowing through the first reference transistor 25r and the amount of current flowing through the second reference transistor 27r can be set to 1:3.

According to this comparator 11, the size ratio between the transistor associated with the first input 13 (input signal input) and the transistor associated with the second input 15 (reference input) defines the division ratio between the current amount of the transistor associated with the signal input of the current from the current source 19 and the current amount of the transistor associated with the reference input.

As described above, according to the above-described embodiment, since the input signal is input to the first signal transistor of the first current path part and the second signal transistor of the second current path part and the current of the current source is divided and flows to both the first current path part and the second current path part in response to the input signal, the response speed of the comparison operation of the comparison stage slows down, that is, the voltage change rate of the node slows down. Thus, since the comparison stage does not respond to short duration waveforms such as noise, it is possible to provide the comparator capable of reducing the occurrence of chattering.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device comprising:
   a first input to which an input signal is input;
   a second input to which a reference signal is input; and
   a comparison stage which includes a current source connected to a first potential and first and second current path parts connected between the current source and a second potential different from the first potential and performing a comparison operation in response to the input signal and the reference signal,
   wherein the first and second current path parts respectively include first and second input circuits which are connected to the current source and first and second load circuits which are connected between the second potential and the first and second input circuits,
   wherein the first input circuit includes a first signal transistor and a first reference transistor which are connected in parallel so that the input signal is input to the first signal transistor and the reference signal is input to the first reference transistor, and
   wherein the second input circuit includes a second signal transistor and a second reference transistor which are connected in parallel so that the input signal is input to the second signal transistor and the reference signal is input to the second reference transistor.

2. The semiconductor device according to claim 1,
   wherein a transistor size of the first reference transistor is smaller than a transistor size of the second reference transistor, and
   wherein a transistor size of the second signal transistor is smaller than a transistor size of the first signal transistor.

3. The semiconductor device according to claim 1,
   wherein the transistor size of the first reference transistor is smaller than the transistor size of the first signal transistor, and
   wherein the transistor size of the second signal transistor is smaller than the transistor size of the second reference transistor.

4. The semiconductor device according to claim 2,
   wherein the transistor size of the first reference transistor is smaller than the transistor size of the first signal transistor, and
   wherein the transistor size of the second signal transistor is smaller than the transistor size of the second reference transistor.

5. The semiconductor device according to claim 1,
   wherein a response speed of the comparison operation is slow when the input signal is a small-amplitude input voltage.

6. The semiconductor device according to claim 2,
   wherein a response speed of the comparison operation is slow when the input signal is a small-amplitude input voltage.

7. The semiconductor device according to claim 1,
   wherein the first load circuit and the second load circuit are provided by a current mirror circuit.

8. The semiconductor device according to claim 2,
   wherein the first load circuit and the second load circuit are provided by a current mirror circuit.

9. The semiconductor device according to claim 1,
   wherein each of the first load circuit and the second load circuit includes a transistor having a gate and a drain connected together.

10. The semiconductor device according to claim 2,
    wherein each of the first load circuit and the second load circuit includes a transistor having a gate and a drain connected together.

11. The semiconductor device according to claim 1,
    wherein each of the first load circuit and the second load circuit includes a resistor.

12. The semiconductor device according to claim 2,
    wherein each of the first load circuit and the second load circuit includes a resistor.

13. The semiconductor device according to claim 1, further comprising:
    a reference voltage source which generates the reference signal.

14. The semiconductor device according to claim 2, further comprising:
    a reference voltage source which generates the reference signal.

15. The semiconductor device according to claim 1, further comprising:
    a voltage source circuit which supplies a voltage to the current source.

16. The semiconductor device according to claim 2, further comprising:
    a voltage source circuit which supplies a voltage to the current source.

17. The semiconductor device according to claim 15, further comprising:
    an output stage to which an output of the voltage source circuit and an output of the comparison stage are input and which outputs an output signal in response to the output of the comparison stage.

18. The semiconductor device according to claim 16, further comprising:
    an output stage to which an output of the voltage source circuit and an output of the comparison stage are input and which outputs an output signal in response to the output of the comparison stage.

* * * * *